(12) United States Patent
Zhang et al.

(10) Patent No.: US 11,647,598 B2
(45) Date of Patent: May 9, 2023

(54) DISPLAY APPARATUS

(71) Applicant: Shanghai Tianma Micro-Electronics Co., Ltd., Shanghai (CN)

(72) Inventors: Xiaoyin Zhang, Shanghai (CN); Jiaxian Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/515,126

(22) Filed: Oct. 29, 2021

(65) Prior Publication Data

US 2022/0053655 A1 Feb. 17, 2022

(30) Foreign Application Priority Data

Sep. 2, 2021 (CN) .......................... 202111025114.8

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .... H05K 5/0217; G06F 1/1652; G06F 1/1624
See application file for complete search history.

(56) References Cited

U.S. PATENT DOCUMENTS

| | | | |
|---|---|---|---|
| 9,286,812 B2* | 3/2016 | Bohn | G06F 1/1624 |
| 10,025,355 B2* | 7/2018 | Bohn | G09F 9/301 |
| 10,194,543 B2* | 1/2019 | Seo | G06F 1/1626 |
| 10,553,135 B2* | 2/2020 | Lee | G06F 3/147 |
| 11,283,910 B2* | 3/2022 | Lee | H04M 1/0268 |
| 11,314,285 B2* | 4/2022 | Feng | G06F 1/1652 |
| 2012/0162876 A1* | 6/2012 | Kim | G06F 1/1652 361/679.01 |
| 2012/0314400 A1* | 12/2012 | Bohn | G09F 9/35 361/679.01 |
| 2016/0100478 A1* | 4/2016 | Lee | G06F 1/1624 361/749 |
| 2017/0060183 A1* | 3/2017 | Zhang | G06F 1/1615 |
| 2018/0014417 A1* | 1/2018 | Seo | H05K 1/189 |
| 2018/0077808 A1* | 3/2018 | Seo | G06F 3/044 |
| 2018/0081473 A1* | 3/2018 | Seo | G06F 1/3215 |
| 2020/0264660 A1 | 8/2020 | Song et al. | |
| 2020/0310497 A1* | 10/2020 | Hsu | E05D 3/18 |
| 2020/0363841 A1 | 11/2020 | Kim et al. | |
| 2021/0105902 A1* | 4/2021 | Yoon | H05K 5/0217 |
| 2021/0181801 A1* | 6/2021 | Yin | H04M 1/0237 |

(Continued)

*Primary Examiner* — Hung S. Bui
*Assistant Examiner* — Sagar Shrestha
(74) *Attorney, Agent, or Firm* — Christensen O'Connor Johnson Kindness PLLC

(57) ABSTRACT

A display apparatus is provided and includes a flexible display screen, a fixator, a rotation rod, and an armrest. The flexible display screen includes a first end and a second end. A direction from the first end to the second end is a first direction, and a direction from the second end to the first end is a second direction. The first end of the flexible display screen is fixed to the fixator, and the second end of the flexible display screen is fixed to the rotation rod. The armrest is provided at a side of the fixator away from the rotation rod. The rotation rod and the armrest are movable relative to the fixator and have opposite rotation directions. The rotation rod rotates while moving relative to the fixator.

20 Claims, 9 Drawing Sheets

(56) References Cited

U.S. PATENT DOCUMENTS

| | | | |
|---|---|---|---|
| 2021/0218835 A1* | 7/2021 | Song | G06F 1/1656 |
| 2021/0373603 A1* | 12/2021 | Feng | G06F 1/1624 |
| 2021/0375165 A1* | 12/2021 | Feng | G09F 9/301 |
| 2022/0253103 A1* | 8/2022 | Choi | H04M 1/0237 |
| 2022/0287193 A1* | 9/2022 | Chun | H05K 5/0217 |

* cited by examiner

DISPLAY APPARATUS

CROSS-REFERENCE TO RELATED APPLICATIONS

The present application claims priority to Chinese Patent Application No. 202111025114.8, filed on Sep. 2, 2021, the content of which is incorporated herein by reference in its entirety.

TECHNICAL FIELD

The present disclosure relates to the field of display technologies, and, particularly, relates to a display apparatus.

BACKGROUND

A flexible display screen is characterized by arbitrarily bendability, light-thin materials, energy-saving, and power-saving. With the development of flexible display technologies, flexible display apparatuses have become mainstream apparatuses in the field of display technologies.

In the related art, the flexible display screen has a generally fixed size. In order to meet the diverse demands of users, a stretchable display apparatus has appeared on the market. When a user does not use the display apparatus, an exposed area of the display screen can be small, which not only can reduce the risk of scratches on the display screen, but also can facilitate device storage. When the display apparatus is used, the display screen can be automatically stretched according to user's demands, so that the exposed area of the display screen meets the user's demands.

However, for the stretchable display apparatuses in the related art, when the display apparatus is automatically stretched to have a larger exposed area of the display screen, it cannot be held well.

SUMMARY

In the present disclosure, a display apparatus is provided. The display apparatus includes a flexible display screen, a fixator, a rotation rod, and an armrest. The flexible display screen includes a first end and a second end that are opposite to each other, the first end of the flexible display screen is fixed to the fixator, and the second end of the flexible display screen is fixed to the rotation rod. The armrest is provided at a side of the fixator facing away from the second end of the flexible display screen. The fixator and the rotation rod are moveable relative to each other. When the rotation rod moves relative to the fixator, the rotation rod rotates. When the rotation rod moves in a first direction, the armrest moves in a second direction and protrudes from the fixator. The first direction is a direction from the first end of the flexible display screen to the second end of the flexible display screen, and the second direction is a direction from the second end of the flexible display screen to the first end of the flexible display screen.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely some of the embodiments of the present disclosure rather than all the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "I" in the context generally indicates that the relation between the objects in front and at the back of "I" is an "or" relationship.

For this specification, it should be understood that the terms "basically", "approximately", "about", "generally" and "substantially" described in claims and embodiments of the present disclosure refer to a substantially approved value, rather than an exact value, within a reasonable process operation range or tolerance range.

It should be understood that although the terms 'first' and 'second' can be used in the present disclosure to describe gears, tracks and ends, these gears, tracks and ends should not be limited to these terms. These terms are used only to distinguish the gears, tracks and ends from each other. For example, without departing from the scope of the embodiments of the present disclosure, a first gear can also be referred to as a second gear. Similarly, the second gear can also be referred to as the first gear.

Figure 1:
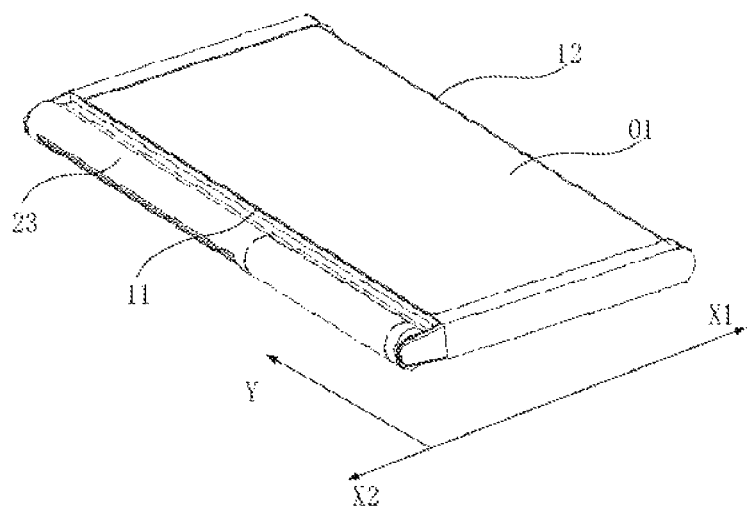
FIG. 1 is a schematic diagram showing a display apparatus according to an embodiment of the present disclosure.
Figure 2:
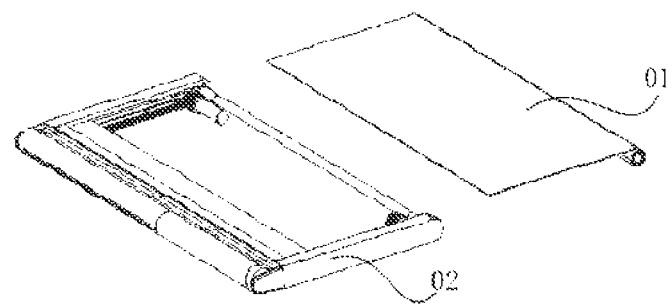
FIG. 2 is an exploded schematic diagram of FIG. 1 according to an embodiment of the present disclosure.
Figure 3:
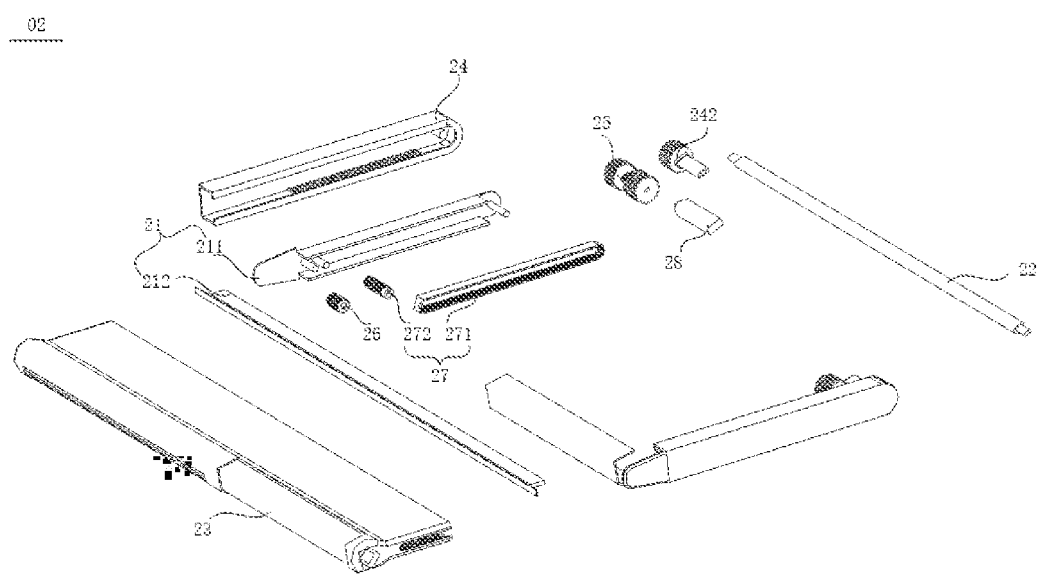
FIG. 3 is an exploded schematic diagram of part 02 shown in FIG. 2 according to an embodiment of the present disclosure.

FIG. 1 is a schematic diagram showing a display apparatus according to an embodiment of the present disclosure. FIG. 2 is an exploded schematic diagram of FIG. 1 according to an embodiment of the present disclosure. FIG. 3 is an exploded schematic diagram of part 02 shown in FIG. 2 according to an embodiment of the present disclosure.

As shown in FIG. 1, FIG. 2 and FIG. 3, the present disclosure provides a display apparatus 001. The display apparatus 001 includes a flexible display screen 01 and an assembly 02. The assembly 02 includes a fixator 21, a rotation rod 22 and an armrest 23. The flexible display screen 01 includes a first end 11 and a second end 12 that are opposite to each other. The first end 11 and the second end 12 of the flexible display screen 01 are opposite ends of the flexible display screen 01 after being fully unfolded. The first end 11 of the flexible display screen 01 is fixed to the fixator 21, and the second end 12 of the flexible display screen 01 is fixed on the rotation rod 22. The first end 11 and the fixator 21 can be fixedly connected to each other by pasting. The second end 12 and the rotation rod 22 can also be fixedly connected to each other by pasting. The armrest 23 is provided at a side of the fixator 21 away from the second end 12 of the flexible display screen 01. In an embodiment, the armrest 23 and the rotation rod 22 are provided at two sides of the fixator 21, respectively.

The fixator 21 and the rotation rod 22 can move relative to each other. When the rotation rod 22 moves relative to the fixator 21, the rotation rod 22 rotates. That is, the rotation rod 22 moves relative to the fixator 21 when the rotation rod 22 is rotating. It can be understood that the flexible display screen 01 has a folded state, an unfolded state, and an intermediate state between the folded state and the unfolded state. In the folded state of the flexible display screen 01, a portion of the flexible display screen 01 close to the second end 12 is wound on the rotation rod 22, so that an exposed area of the flexible display screen 01 is reduced, that is, the display area of the flexible display screen is the smallest. In the unfolded state of the flexible display 01, except for a portion fixed to the rotation rod 22, other portions of the flexible display 01 wound on the rotation rod 22 are all unfolded, so that the exposed area of the flexible display 01 is increased, that is, the display area of the flexible display screen is the largest. The display area of the flexible display screen 01 in the unfolded state is larger than that of the flexible display screen 01 in the folded state. In an embodiment, in the unfolded state of the flexible display screen 01, the fixator 21 is located at a backlight side of the flexible display screen 01.

It should be noted that, in an embodiment of the present disclosure, when the flexible display screen 01 is in the folded state, only a portion of the display region is wound on the rotation rod 22, and a portion that is not wound on the rotation rod 22 can still display images. In addition, when the flexible display screen 01 is in the folded state, the entire display region of the flexible display screen 01 can be completely wound on the rotation rod 22.

In a process of changing the flexible display screen 01 from the folded state to the unfolded state, the rotation rod 22 moves relative to the fixator 21 while the rotation rod 22 is rotating, so that the portion of the flexible display screen 01 wound on the rotation rod 22 is unfolded, thereby increasing the exposed area of the flexible display screen 01. In a process changing the flexible display screen 01 from the unfolded state to the folded state, the rotation rod 22 moves relative to the fixator 21 while the rotation rod 22 is rotating, so that the unfolded portion of the flexible display screen 01 close to the rotation rod 22 is wound on the rotation rod 22, thereby reducing the exposed area of the flexible display 01.

In the present disclosure, in a plane parallel to the display apparatus, a direction from the first end 11 of the flexible display screen 01 to the second end 12 of the flexible display screen 01 is a first direction X1, and a direction from the second end 12 of the flexible display screen 01 to the first end 11 of the flexible display screen 01 is a second direction X2. When the rotation rod 22 moves along the first direction X1, the armrest 23 moves in the second direction X2 and protrudes from the fixator 21. That is, when the rotation rod 22 moves along a direction from a position close to the fixator 21 to a position away from the fixator 21, the armrest 23 also moves along a direction from a position close to the fixator 21 to the position away from the fixator 21, and the armrest 23 and the rotation rod 22 move by away from each other, respectively. It can be understood that when the rotation rod 22 moves along a direction from a position away from the fixator 21 to a position close to the fixator 21, the armrest 23 also moves along a direction from a position away from the fixator 21 to a position close to the fixator 21, and the armrest 23 and the rotation rod 22 move by facing towards each other.

In the present disclosure, the rotation rod 22 rotates while moving in the first direction X1, which drives a portion of the flexible display screen 01 that is wound on the rotation rod 22 to unfold, so that the exposed area of the flexible display screen 01 is increased, thereby realizing stretching outwards of the flexible display screen 01. Meanwhile, the armrest 23 moves along the second direction X2 and protrudes from the fixator 21 to provide the user with a place where the hands can be placed, thereby facilitating hand operation during the stretching process of the flexible display 01, and greatly improving user's experience.

Figure 4:
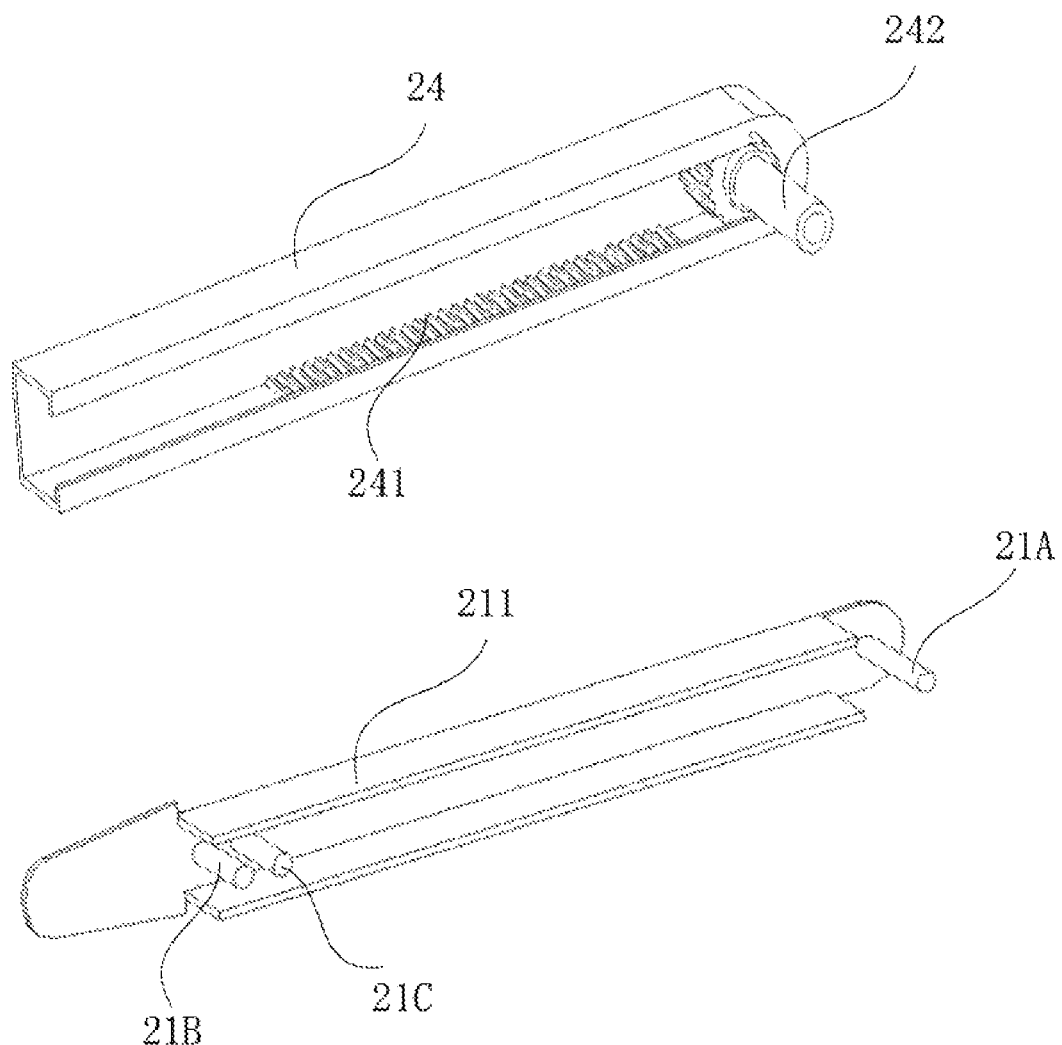
FIG. 4 is a schematic diagram showing the details and assembly of some parts shown in FIG. 3 according to an embodiment of the present disclosure.
Figure 5:
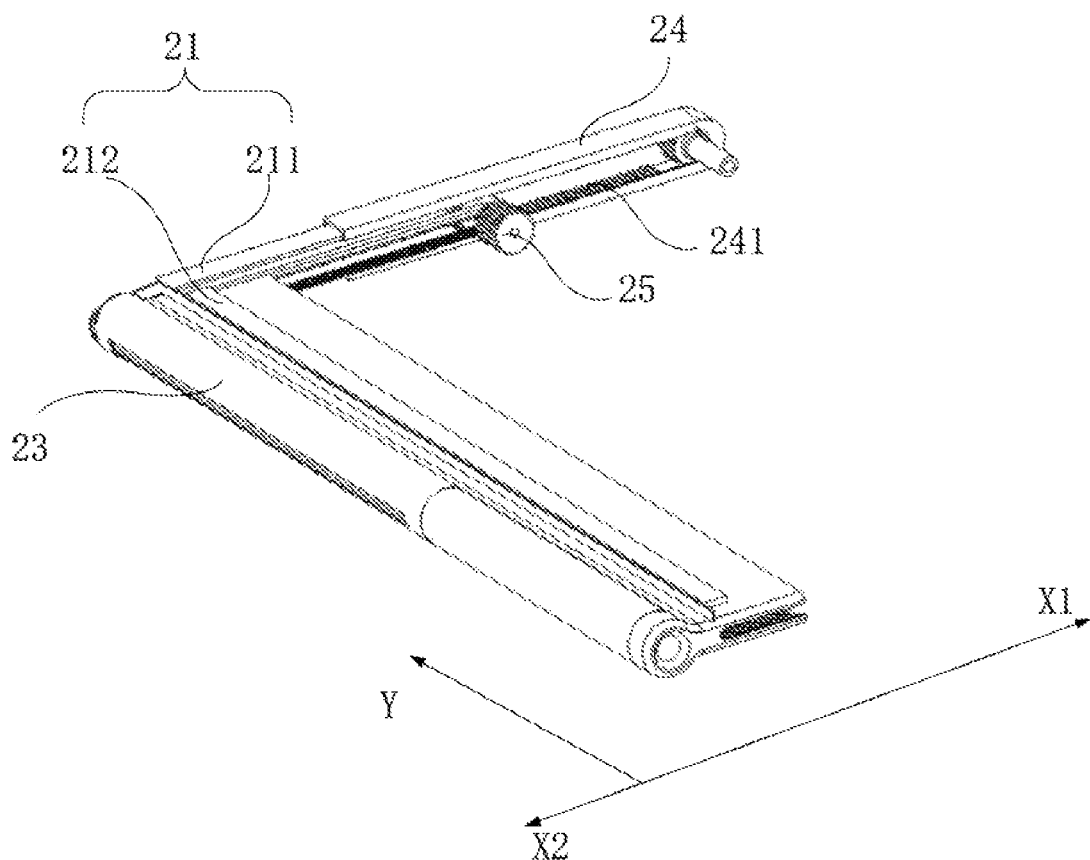
FIG. 5 is a schematic diagram showing an assembly of parts according to an embodiment of the present disclosure.

FIG. 4 is a schematic diagram showing the details and assembly of some parts shown in FIG. 3 according to an embodiment of the present disclosure. FIG. 5 is a schematic diagram showing an assembly of parts according to an embodiment of the present disclosure.

In an embodiment of the present disclosure, combining FIG. 3 with FIG. 4, the assembly 02 in the display apparatus 001 further includes a slidable device 24 and a first gear 25. The slidable device 24 includes a first driving chain 241 fixed in the slidable device 24. The first gear 25 is provided on the fixator 21 via a first positioning post 21A of the fixator 21. The rotation rod 22 is provided on the slidable device 24 via a fixing post 242. The first gear 25 can rotate around its fixed point on the fixator 21, and the rotation rod 22 can rotate around its fixed point on the slidable device 24. The slidable device 24 can move relative to the fixator 21.

As shown in FIG. 5, the first driving chain 241 is provided at a side of the slidable device 24 that is in contact with the first gear 25. The first gear 25 meshes with the first driving chain 241. The first gear 25 rotates to drive the driving chain 241 to move, so that the slidable device 24 and the fixator 21 move relative to each other. The slidable device 24 drives the rotation rod 22 to move relative to the fixator 21.

In the present disclosure, when the fixator 21 rotates, the first gear 25 drives the first driving chain 241 in the slidable device 24 to move through the meshing of the gears, thereby driving the slidable device 24 to move, that is, the slidable device 24 is driven to move relative to the fixator 21. Since the rotation rod 22 is provided on the slidable device 24, the rotation rod 22 can move relative to the fixator 21. Also, since the first end 11 of the flexible display screen 01 is fixed to the fixator 21, the second end 12 of the flexible display screen 01 is fixed to the rotation rod 22, and a portion of the flexible display screen 01 close to the second end 12 can be wound on the rotation rod 22, the movement of the rod 22 relative to the fixator 21 can increase or decrease the exposed area of the flexible display screen 01, thereby achieving folding or unfolding of the flexible display screen 01.

Figure 6:
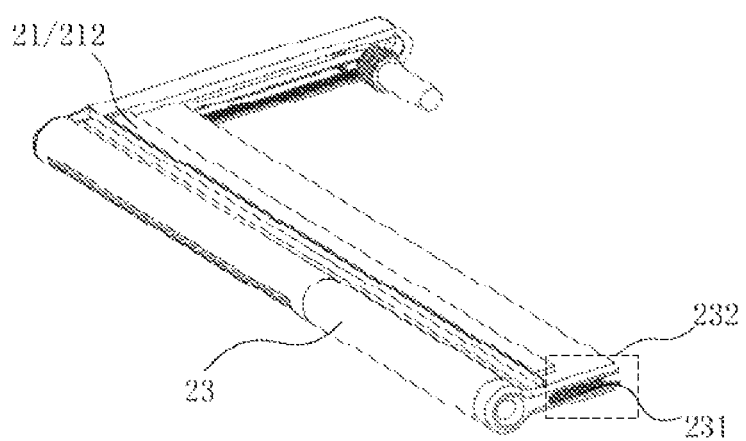
FIG. 6 is a schematic diagram of another assembly of parts according to another embodiment of the present disclosure.
Figure 7:
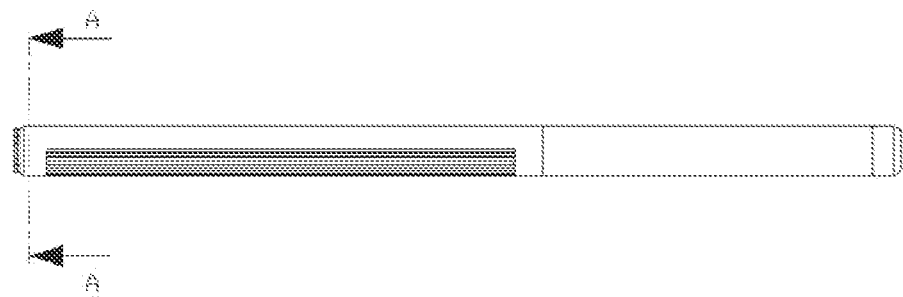
FIG. 7 is a left view of FIG. 6 according to an embodiment of the present disclosure.
Figure 8:
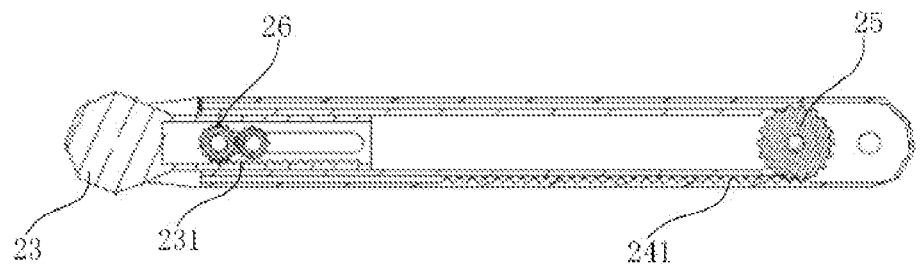
FIG. 8 is a schematic cross-sectional view taken along line AA in FIG. 7 according to an embodiment of the present disclosure.

FIG. 6 is a schematic diagram of another assembly of parts according to another embodiment of the present disclosure, FIG. 7 is a left view of FIG. 6 according to an embodiment of the present disclosure, and FIG. 8 is a schematic cross-sectional view taken along line AA in FIG. 7 according to an embodiment of the present disclosure.

In an embodiment of the present disclosure, combining FIG. 3 and FIG. 4, the assembly 02 in the display apparatus 001 further includes a second gear 26 provided on the fixator 21. The second gear 26 is fixed on the fixator 21 through the second positioning post 21B, and the second gear 26 can rotate around its fixed point on the fixator 21. As shown in FIG. 6 and FIG. 8, the armrest 23 includes a second driving chain 231 fixed in the armrest 23.

Referring to FIG. 6, FIG. 7 and FIG. 8, the second driving chain 231 is provided in the armrest 23 and at a side of the armrest 23 in contact with the second gear 26. The second gear 26 meshes with the second driving chain 231, and drives the second driving chain 231 to move, so that the armrest 23 and the fixator 21 move relative to each other.

In the present disclosure, when provided on the fixator 21 rotates, the second gear 26 drives the second driving chain 231 in the armrest 23 to move through the meshing action of the gear, thereby driving the armrest 23 to move, i.e., driving the armrest 23 to move relative to the fixator 21. When the armrest 23 moves along the second direction X2, i.e., when the armrest 23 moves along a direction away from the rotation rod 22, the armrest 23 protrudes from the fixator 21. Therefore, it provides for users a place where hands can be placed, which is convenient for the users to hold the display apparatus 001, thereby improving user's experience.

Referring to FIG. 6, the armrest 23 can further include a sliding groove 232 in which the second driving chain 231 is provided. The second driving chain 231 is provided in the sliding groove 232, which not only improves the aesthetics of the armrest 23, but also improves the hand-holding comfort of the armrest 23.

Figure 9:
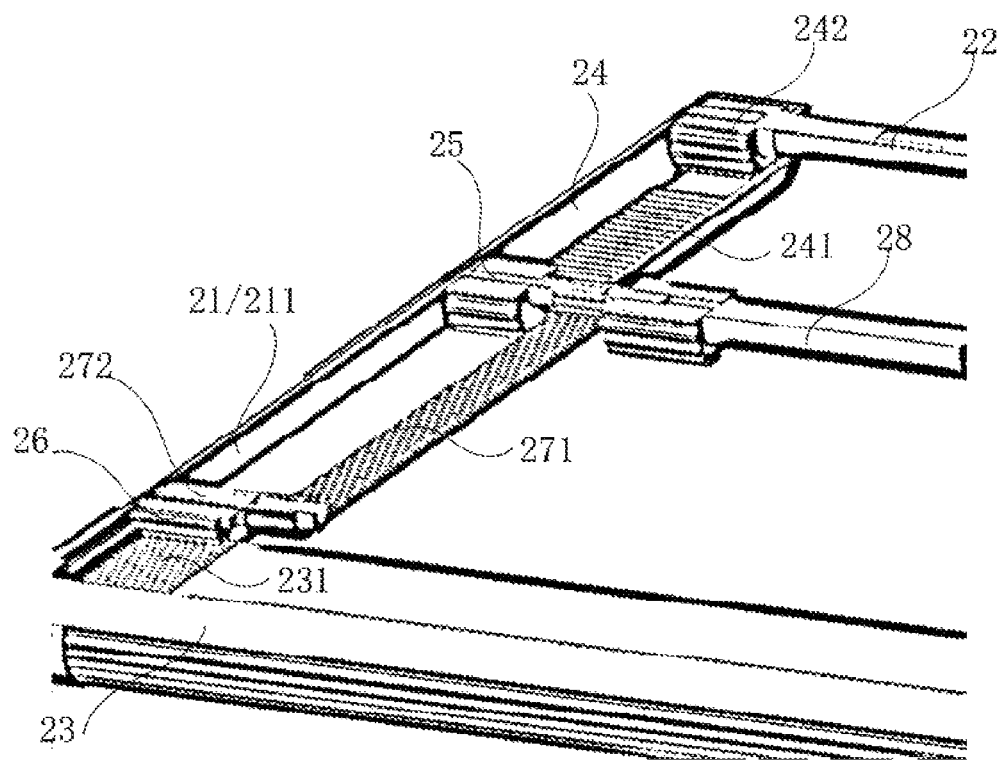
FIG. 9 is a cross-sectional view showing a display apparatus according to an embodiment of the present disclosure.

FIG. 9 is a cross-sectional view showing a display apparatus according to an embodiment of the present disclosure.

In an embodiment of the present disclosure, referring to FIG. 3, FIG. 5 and FIG. 9, the fixator 21 includes a fixing beam 211 extending along the first direction X1. The first gear 25 and the second gear 26 are both fixed to the fixing beam 211.

Referring to FIG. 5, in an embodiment of the present disclosure, the slidable device 24 is sleeved on the fixing beam 211. When the slidable device 24 and the fixator 21 move relative to each other, the slidable device 24 slides along the fixing beam 211. It can be understood that the slidable device 24 can move along the fixing beam 211 in the first direction X1 or the second direction X2.

Combining FIG. 3 with FIG. 5, in an embodiment of the present disclosure, the fixator 21 further includes a blocking plate 212 fixed to the fixing beam 211. The blocking plate 212 extends along a third direction Y intersecting with the first direction X1. The first end 11 of the flexible display screen 01 is fixed to the blocking plate 212.

Figure 10:
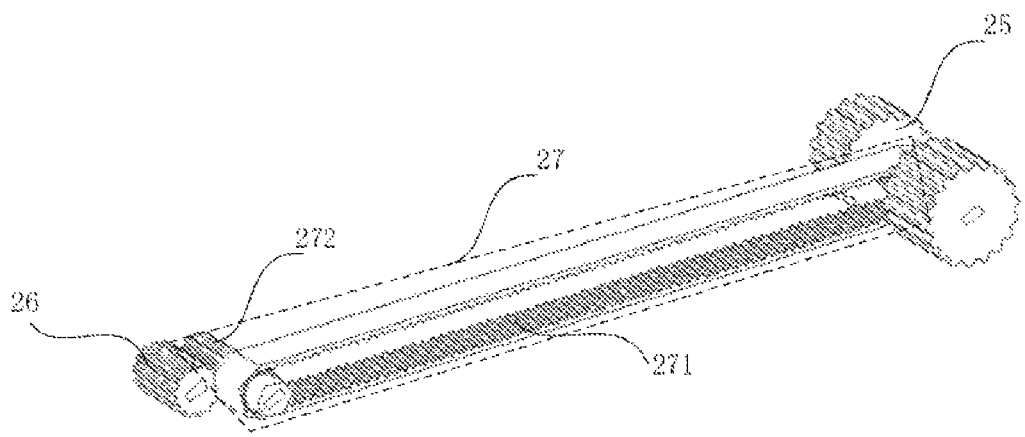
FIG. 10 is a schematic diagram showing a transmission according to an embodiment of the present disclosure.
Figure 11:
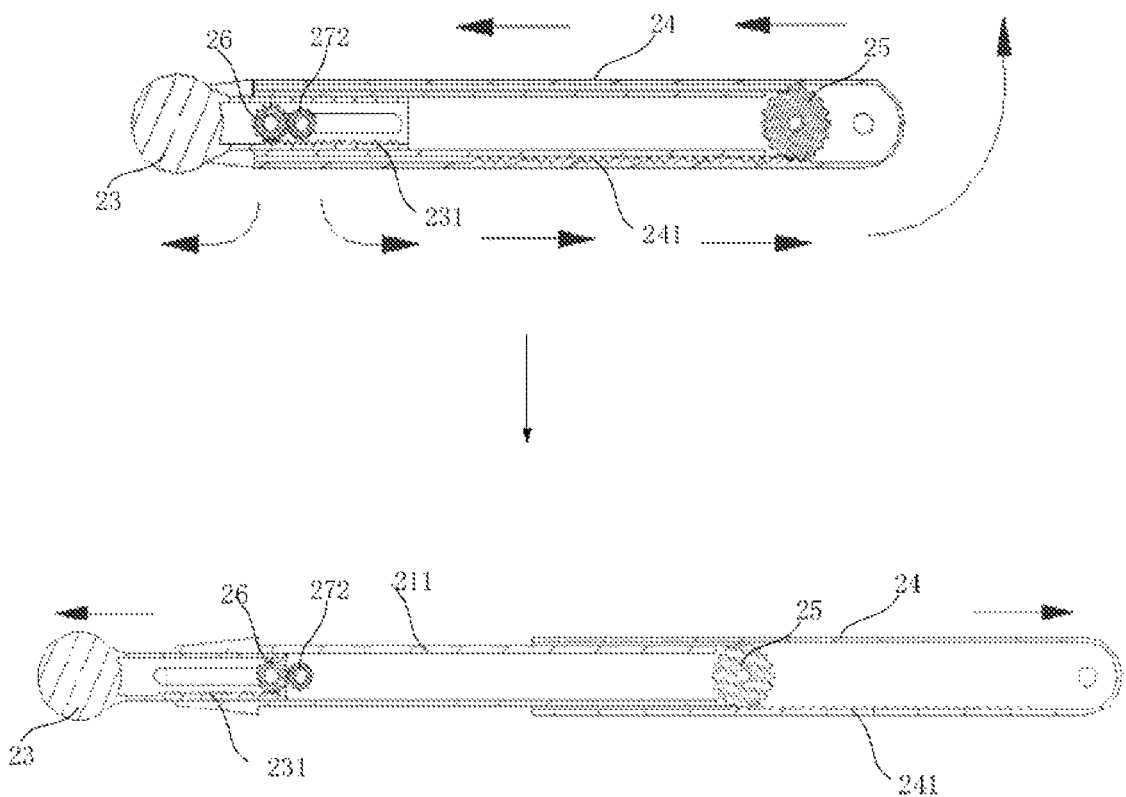
FIG. 11 is a schematic diagram showing a movement of parts according to an embodiment of the present disclosure.

FIG. 10 is a schematic diagram showing a transmission according to an embodiment of the present disclosure, and FIG. 11 is a schematic diagram showing a movement of parts according to an embodiment of the present disclosure.

In an embodiment of the present disclosure, referring to FIG. 3, FIG. 9 and FIG. 10, the assembly 02 of the display apparatus 001 further includes a transmission 27 connecting the first gear 25 with the second gear 26. When one of the first gear 25 and the second gear 26 rotates, the transmission 27 drives the other of the first gear 25 and the second gear 26 to rotate. That is, when the first gear 25 is rotated by an external force, it drives the second gear 26 to rotate through the transmission 27. When the second gear 26 is rotated by an external force, it drives the first gear 25 to rotate through the transmission 27. A rotation direction of the first gear 25 and a rotation direction of the second gear 26 can be the same or different from each other.

In the present disclosure, combining FIG. 1 to FIG. 11, the first gear 25 and the second gear 26 rotate simultaneously. That is, the second gear 26 drives the armrest 23 moves relative to the fixator 21 while the first gear 25 drives the slidable device 24 and the fixator 21 to move relative to each other. Since the rotation rod 22 is provided on the slidable device 24, the second gear 26 drives the armrest 23 and the fixator 21 to move relative to each other while the rotation rod 22 and the fixator 21 move relative to each other, i.e., the rotation rod 22 and the armrest 23 moves relative to the fixator 21 at the same time. A moving direction of the armrest 23 is opposite to a moving direction of the rotation rod 22.

Since the first end 11 of the flexible display screen 01 is fixed to the fixator 21, and the second end 12 of the flexible display screen 01 is fixed to the rotation rod 22, the portion of the flexible display screen 01 close to the second end 12 is wound on the rotation rod 22 in the folded state of the flexible display screen 01. When the rotation rod 22 moves in the first direction X1, that is, when the rotation rod 22 moves in a direction from a position close to the fixator 21 to a position away from the fixator 21, the portion of the flexible display screen 01 wound on the rotation rod 22 is driven to unfold, thereby increasing the exposed area of the flexible display screen 01, and thus stretching outward of the flexible display screen 01. Meanwhile, the armrest 23 moves in the second direction X2, i.e., the armrest 23 and the rotation rod 22 move away from each other, and the armrest 23 protrudes from the fixator 21, so that it provides the user with a place where the hands can be placed, thereby facilitating hand holding the display apparatus 001, and improving user's experience.

It should be understood that when the rotation rod 22 moves in the second direction X2, that is, when the rotation rod 22 moves from a position away from the fixator 21 to a position close to the fixator 21, the portion of the flexible display screen 01 close to the rotation rod 22 is wound on the rotation rod 22, thereby reducing the exposed area of the flexible display screen 01, and achieving unfolding of the flexible display screen 01. Meanwhile, the armrest 23 moves in an opposite direction to the rotation rod 22, i.e., the armrest 23 moves in the first direction X1, that is, the armrest 23 moves towards the rotation rod 22, so that the exposed area of the armrest 23 is reduced.

It can be seen from the above analysis that the simultaneous rotation of the first gear 25 and the second gear 26 realizes the linkage between stretching of the armrest 23 and stretching of the flexible display screen 01. While realizing stretching of the flexible display screen 01, it provides for the user with a place where the hands can be accessed, thereby greatly improving user's sense of experience. Moreover, after the flexible display screen 01 is folded, the exposed area of the armrest 23 is small, thereby facilitating the storage of the display apparatus 001.

Figure 12:
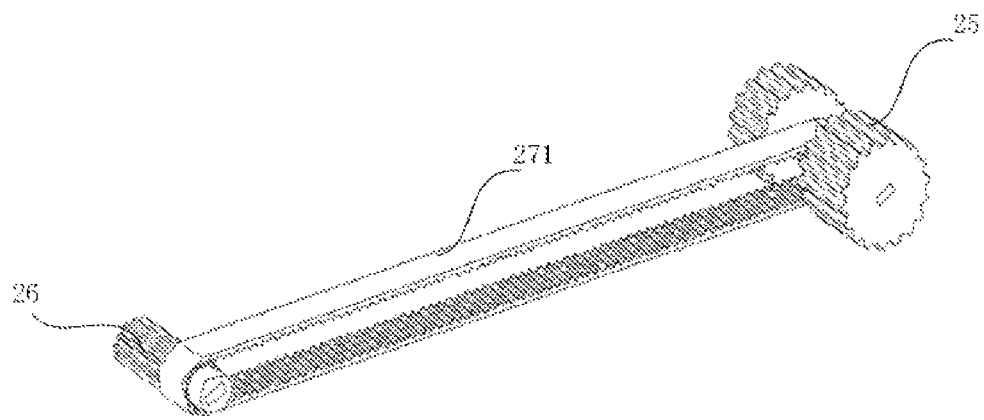
FIG. 12 is a schematic diagram showing a transmission according to another embodiment of the present disclosure.
Figure 13:
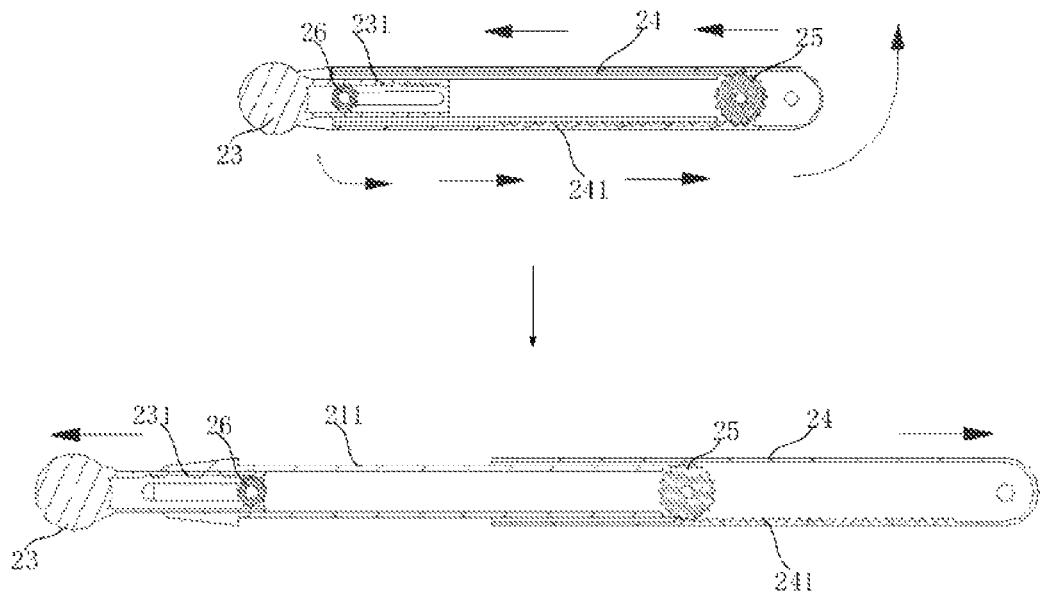
FIG. 13 is a schematic diagram showing a movement of parts according to another embodiment of the present disclosure.

FIG. 12 is a schematic diagram showing a transmission according to another embodiment of the present disclosure, and FIG. 13 is a schematic diagram showing a movement of parts according to another embodiment of the present disclosure.

As shown in FIG. 12, in an embodiment of the present disclosure, the transmission 27 includes a driving member 271, and the driving member 271 is in contact with both the first gear 25 and the second gear 26. When one of the first gear 25 and the second gear 26 rotates, the driving member 271 drives the other one of the first gear 25 and the second gear 26 to rotate, and a rotation direction of the first gear 25 and a rotation direction of the second gear 26 are the same.

The driving member 271 is in contact with both the first gear 25 and the second gear 26, that is, the first driving member 271 overlaps with each of the second gear 25 and the second gear 26.

In the present disclosure, the first gear 25 and the second gear 26 rotate simultaneously and have a same rotation direction. As shown in FIG. 13, the first gear 25 meshes with the first driving chain 241, and the second gear 26 meshes with the second driving chain 231. When the first gear 25 and the second gear 26 rotate in the first direction simultaneously, for example, when the first gear 25 and the second gear 26 rotate in counterclockwise direction simultaneously, the first gear 25 drives the slidable device 24 to move away from the fixator 21, thereby driving the rotation rod 22 to move away from the fixator 21. The second gear 26 drives the armrest 23 and the rotation rod 22 to move away from each other. It can be understood that when the first gear 25 and the second gear 26 rotate along the second rotation direction, for example, when the first gear 25 and the second gear 26 rotate in a clockwise direction simultaneously, the first gear 25 drives the slidable device 24 to move towards the fixator 21, so that the rotation rod 22 is driven to move towards the fixator 21, and the second gear 26 drives the armrest 23 and the rotation rod 22 to move towards each other.

When the first gear 25 and the second gear 26 rotate in the same direction simultaneously, if the slidable device 24 where the first driving chain 241 is located and the armrest 23 where the second driving chain 231 is located move in opposite directions, respectively, the first driving chain 241 can be located below the first gear 25, and the second driving chain 231 can be located above the second gear 26; or the first driving chain 241 can be located above the first gear 25, and the second driving chain 231 can be located below the second gear 26.

In an embodiment of the present disclosure, referring to FIG. 4 and FIG. 10, the transmission 27 includes a driving member 271 and a third gear 272. The third gear is fixed on the fixator 21 through a third positioning post 21C. One of the first gear 25 and the second gear 26 meshes with the third gear 272, and the other one of the first gear 25 and the second gear 26 is connected to the third gear 272 through the driving member 271. When one of the first gear 25 and the second gear 26 rotates, the other one of the first gear 25 and the second gear 26 is driven by the transmission 27 to rotate, and the rotation directions of the first gear 25 and the second gear 26 are opposite to each other. In another embodiment, when the third gear 272 rotates, the rotation direction of one of the first gear 25 and the second gear 26 that meshes with the third gear 272 is opposite to the rotation direction of the third gear 272, and the rotation direction of the other one of the first gear 25 and the second gear 26 is same as the rotation direction of the third gear 272. That is, when one of the first gear 25, the second gear 26 and the third gear 272 is driven to rotate by an external force applied thereon, the first gear 25 and the second gear 26 rotate simultaneously in opposite directions.

For example, referring to FIG. 10, the second gear 26 meshes with the third gear 272. The first gear 25 and the third gear 272 are connected to each other by the driving member 271. When the first gear 25 rotates counterclockwise, the first gear 25 drives the third gear 272 to rotate counterclockwise, and then the third gear 272 drives the second gear 26 to rotate clockwise.

In an embodiment of the present disclosure, the first gear 25 and the second gear 26 rotate simultaneously in opposite directions. As shown in FIG. 11, the first gear 25 meshes with the first driving chain 241, and the second gear 26 meshes with the second driving chain 231. When the first gear 25 rotates counterclockwise, the first gear 25 drives the slidable device 24 to move away from the fixator 21, thereby driving the rotation rod 22 to move away from the fixator 21 simultaneously, the second gear 26 rotates clockwise to drive the armrest 23 and the rotation rod 22 to move away from each other. It can be understood that when the first gear 25 rotates clockwise, the first gear 25 drives the slidable device 24 to move towards the fixator 21, thereby driving the rotation rod 22 to move towards the fixator 21. At this time, the second gear 26 rotates counterclockwise to drive the armrest 23 and the rotation rod 22 to move towards each other.

When the first gear 25 and the second gear 26 rotate in opposite directions simultaneously, if the slidable device 24 where the first driving chain 241 is located and the armrest 23 where the second driving chain 231 is located, move in opposite directions, the first driving chain 241 can be located above the first gear 25, and the second driving chain 231 can be located above the second gear 26; or, the first driving chain 241 can be located below the first gear 25, and the second driving chain 231 can be located below the second gear 26.

In an embodiment of the present disclosure, the driving member 271 is one of a driving belt and a chain and is configured to achieve synchronous transmission of kinetic energy.

In an embodiment of the present disclosure, referring to FIG. 3, the assembly 02 of the display apparatus 001 further includes a motor 28, and the motor 28 is configured to drive one of the first gear 25 and the second gear 26 to rotate. That is, the motor 28 drives the first gear 25 to rotate, or drives the second gear 26 to rotate. When the motor 28 drives the first gear 25 to rotate, the first gear 25 drives the second gear 26 to rotate through the transmission 27. The rotation direction of the first gear 25 and the rotation direction of the second gear 26 can be the same or different. When the motor 28 drives the second gear 26 to rotate, the second gear 26 drives the first gear 25 to rotate through the transmission 27. The rotation direction of the second gear 26 and the rotation direction of the first gear 25 can be the same or different.

In an embodiment of the present disclosure, referring to FIG. 3, the assembly 02 of the display apparatus 001 further includes a motor 28, and the motor 28 is configured to drive the third gear 272 to rotate. It can be understood that when the motor 28 drives the third gear 272 to rotate, the third gear 272 drives one of the first gear 25 and the second gear 26 that meshes with the third gear 272 to rotate, and drives the other one of the first gear 25 and the second gear 26 to rotate through the driving member 271. The rotation directions of the first gear 25 and the rotation direction of the second gear 26 are opposite from each other.

For example, the second gear 26 meshes with the third gear 272, and the first gear 25 and the third gear 272 are connected to each other by the driving member 271. When the motor 28 drives the third gear 272 to rotate, the third gear 272 drives the second gear 26 to rotate, and the rotation directions of the second gear 26 and the third gear 272 are opposite to each other. Meanwhile, the third gear 272 drives the first gear 25 to rotate through the driving member 271, and the rotation direction of the first gear 25 and the rotation direction of the third gear 272 are the same. The rotation directions of the first gear 25 and the rotation direction of the second gear 26 are opposite to each other. For example, the first gear 25 meshes with the third gear 272, and the second gear 26 and the third gear 272 are connected to each other by the driving member 271. When the motor 28 drives the third gear 272 to rotate, the third gear 272 drives the first gear 25 to rotate, and the rotation direction of the first gear 25 and the rotation direction of the third gear 272 are opposite to each other. Meanwhile, the third gear 272 drives the second gear 26 to rotate through the driving member 271, and the rotation direction of the second gear 26 and the rotation direction of the third gear 272 are the same. The rotation direction of the first gear 25 and the rotation direction of the second gear 26 are opposite to each other.

In an embodiment of the present disclosure, referring to FIG. 11 and FIG. 13, in a process where the rotation rod 22 moves from a position close to the fixator 21 to a position away from the fixator 21, a period for driving the first driving chain 241 to move by the first gear 25 is equal to a period for driving the second driving chain 231 to move by the second gear 26. That is, the period in which the first gear 25 drives the slidable device 24 to move from the position close to the fixator 21 to the position away from the fixator 21 is equal to the period in which the second gear 26 drives the armrest 23 to move from the position close to the fixator 21 to the position away from the fixator 21. It should be understood that in a process for the rotation rod to move from a position away from the fixator 21 to a position close to the fixator 21, the period for driving the first driving chain 241 by the first gear 25 is equal to the period for driving the second driving chain 231 by the second gear 26.

The period for driving the first driving chain 241 to move by the first gear 25 is equal to the period for driving the second driving chain 231 to move by the second gear 26, which can effectively achieve the movement of the rotation rod 22 relative to the fixator 21 and the movement of armrest 23 relative to the fixator to be synchronized, thereby avoiding mutual influence between the stretching of the armrest 23 and the stretching of the flexible display screen 01. This not only solves the problem that the armrest 23 may be pushed out to detach from the fixator 21, but also solves the problem when the armrest 23 is not completely stowed thus increasing the exposed area, which causes the display apparatus 001 to be inconvenient to store.

In an embodiment of the present disclosure, the number of chain elements in the second driving chain 231 is greater than or equal to the number of chain elements in the first driving chain 241. The chain element refers to a snap joint used to mesh with the gears between the teeth in the driving chain. In an embodiment of the present disclosure, the rotation time of the first gear 25 is equal to the rotation time of the second gear 26. When the first gear 25 drives the first driving chain 241 to move along the first direction X1, so that when the flexible display screen 01 is changed from the folded state to the unfolded state, since the number of chain elements in the second driving chain 231 is not smaller than the number of the chain elements in the first chain element 241, the risk of the second gear 26 driving the armrest 23 to detach from the fixator 21 is avoided.

Figure 14:
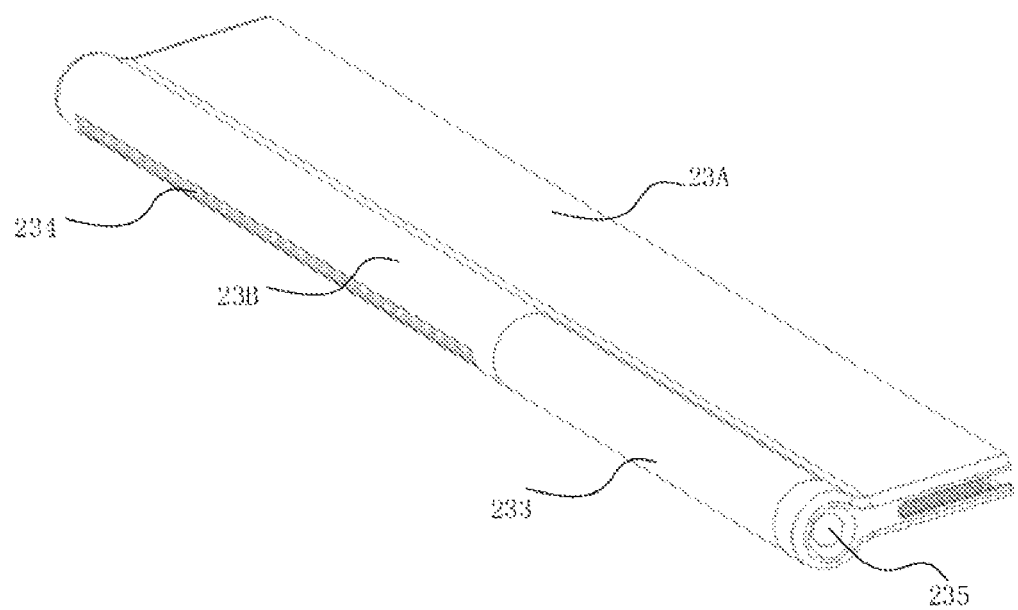
FIG. 14 is a schematic diagram showing an armrest according to an embodiment of the present disclosure.

FIG. 14 is a schematic diagram showing an armrest according to an embodiment of the present disclosure.

In an embodiment of the present disclosure, referring to FIG. 2, FIG. 3 and FIG. 14, the armrest 23 includes a first side 23A and a second side 23B that are opposite to each other. The second side 23B is located at a side of the first side 23A away from the rotation rod 22. The second side 23B has a thickness greater than a thickness of the first side 23A. It can be understood that the second side 23B is located at an outer edge of the display apparatus 001. In an embodiment of the present disclosure, the thickness of the second side 23B is greater than the thickness of the first side 23A, which can seal the inside of the display apparatus 001, thereby preventing dust and debris from entering the inside of the display apparatus 001. Meanwhile, the relative thick second side 23B can also reserve a position for additional functions on the second side 23B.

As shown in FIG. 14, in an embodiment of the present disclosure, the second side 23B of the armrest is a circular convex structure, which further enhances the comfort of the hand holding while providing the hand holding position.

In an embodiment of the present disclosure, please continue to refer to FIG. 14, the armrest 23 includes a display panel 233. The display panel 233 can be configured to display the stretching state of the flexible display screen 01. For example, the display panel 233 is configured to display the percentage of the exposed area of the flexible display screen 01 to the total area of the flexible display screen 01. The display panel 233 can also be used to display related information such as calendar and weather. It should be noted that the display panel 233 can be provided at the second side 23B of the armrest 23. Meanwhile, a hand-held region is reserved on the second side 23B in addition to the region where the display panel 233 is provided. This not only facilitates the user to view the display information, but also prevents the display panel 233 from being worn out due to being touched frequently by hands.

Referring to FIG. 14, in an embodiment of the present disclosure, at least a part of regions of the armrest 23 is further provided with a plurality of concave-convex structures 234. The concave-convex structure 234 can be arranged to have an anti-slip effect. When the user puts his hand on the armrest 23, the frictional force is enhanced, thereby achieving the firmness of hand holding.

In an embodiment of the present disclosure, as shown in FIG. 14, the armrest 23 further includes at least one external port 235, and the at least one external port 235 is at least one of a charging port, a headphone port, or a microphone port. The external port 235 can be provided at at least one end of the second side 23B in the armrest 23, which is convenient for use. With the external port 235 provided on the armrest 23, additional functions of the display apparatus 001 can be added and the functionality of the display apparatus 001 can be increased.

Figure 15:
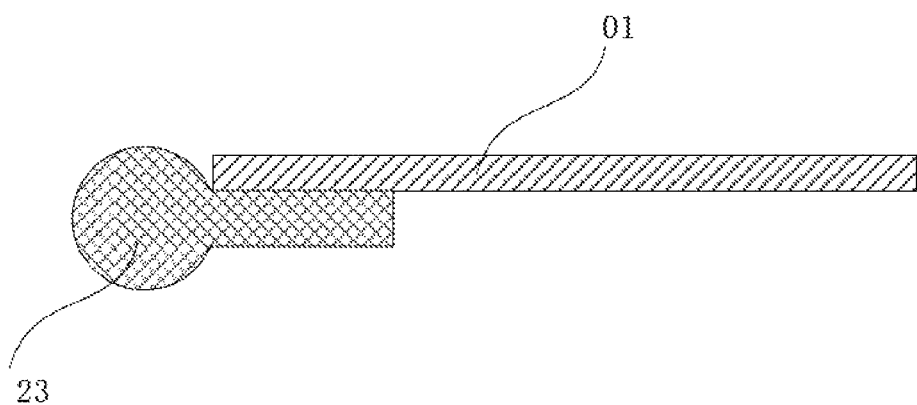
FIG. 15 is a schematic diagram showing positions of an armrest and a flexible display screen according to an embodiment of the present disclosure.

FIG. 15 is a schematic diagram showing positions of an armrest and a flexible display screen according to an embodiment of the present disclosure.

As shown in FIG. 15, in an embodiment of the present disclosure, when the rotation rod 22 does not move away from the fixator 21, the edge of the armrest 23 away from the rotation rod 22 is not covered by the flexible display screen 01. That is, when the flexible display screen 01 is in the folded state, the second side 23B of the armrest 23 protrudes from the flexible display screen 01. At the beginning of the flexible display screen 01 from the folded state to the intermediate state/unfolded state, it is still achieved that the user can hold the armrest 23 by hand. FIG. 15 only illustrates one covering relationship between the armrest 23 and the flexible display screen 01, and its internal structure and other components in the display apparatus 001 are not shown.

Figure 16:
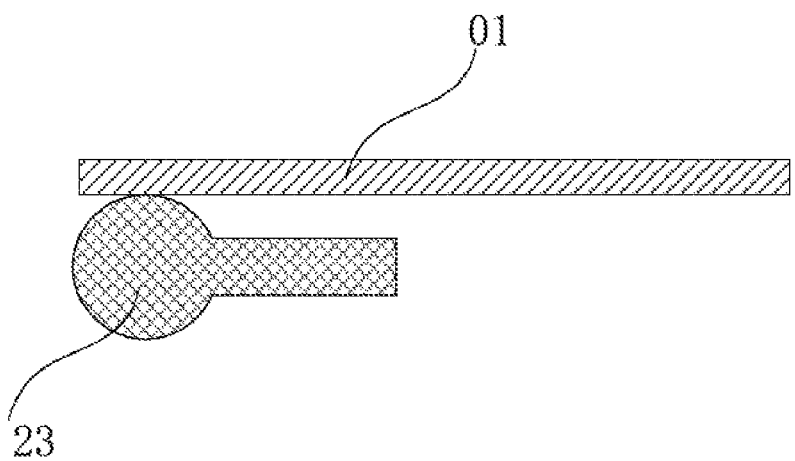
FIG. 16 is a schematic diagram showing positions of the armrest and the flexible display screen according to another embodiment of the present disclosure.

FIG. 16 is a schematic diagram showing positions of the armrest and the flexible display screen according to another embodiment of the present disclosure.

In an embodiment provided by the present disclosure, as shown in FIG. 16, when the rotation rod 22 does not move away from the fixator 21, the edge of the armrest 23 away from the rotation rod 22 is covered by the flexible display screen 01. That is, when the flexible display screen 01 is in the folded state, the second side 23B of the armrest 23 is covered by the flexible display screen 01, so that the exposed area of the armrest 23 is further reduced, thereby facilitating the storage of the display apparatus 001 and achieving a larger screen-to-body ratio of the display apparatus 001 when the flexible display screen 01 is not unfolded. It should be noted that FIG. 16 only illustrates one covering relationship between the armrest 23 and the flexible display screen 01, and its internal structure and other components in the display apparatus 001 are not shown.

In the present disclosure, the first gear 25 provided on the fixator 21 meshes with the first driving chain 241 in the slidable device 24, and the second gear 26 provided on the fixator 21 meshes with the second driving chain 231 in the armrest 23. The first gear 25 and the second gear 26 rotate simultaneously. It means that the second gear 26 drives the armrest 23 and the fixator 21 to move relative to each other while the first gear 25 drives the slidable device 24 and the fixator 21 to move relative to each other. Since the rotation rod 22 is provided on the slidable device 24, the second gear 26 drives the armrest 23 and the fixator 21 to move relative to each other while the rotation rod 22 and the fixator 21 move relative to each other. That is, the rotation rod 22 and the armrest 23 simultaneously move relative to the fixator 21. In the present disclosure, the moving direction of the armrest 23 is opposite to the moving direction of the rotation rod 22. Since the first end 11 of the flexible display screen 01 is fixed to the fixator 21, the second end 12 is fixed to the rotation rod 22, and in the folded state of the flexible display screen 01, the part of the flexible display screen 01 close to the second end 12 is wound on the rotation rod 22. When the rotation rod 22 moves along the first direction X1, that is, when the rotation rod 22 moves from a position close to the fixator 21 to a position away from the fixator 21, the portion of the flexible display screen 01 wound on the rotation rod 22 is unfolded, thereby increasing the exposed area of the flexible display screen 01, and achieving stretching outward of the flexible display screen 01. Meanwhile, the armrest 23 moves along the second direction X2 (i.e., a direction opposite to the moving direction of the rotation rod 22), and protrudes from the fixator 21 to provide the user with a place where the hands can be placed, and thereby facilitating hand holding of the display device 001, and improving user's sense of experience.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display apparatus, comprising:
   a flexible display screen, wherein the flexible display screen comprises a first end and a second end that are opposite to each other;
   a fixator, wherein the first end of the flexible display screen is fixed to the fixator;
   a rotation rod, wherein the second end of the flexible display screen is fixed to the rotation rod; and
   an armrest provided at a side of the fixator facing away from the second end of the flexible display screen,
   wherein the fixator and the rotation rod are moveable relative to each other, and when the rotation rod moves relative to the fixator, the rotation rod rotates; when the rotation rod moves along a first direction, the armrest moves relative to the fixator along a second direction and protrudes from the fixator; wherein the first direction is a direction from the first end of the flexible display screen to the second end of the flexible display screen, and the second direction is a direction from the second end of the flexible display screen to the first end of the flexible display screen.

2. The display apparatus according to claim 1, further comprising:
   a slidable device comprising a first driving chain; and
   a first gear provided on the fixator,
   wherein the rotation rod is located on the slidable device, the first gear meshes with the first driving chain, the first gear is configured to drive the first driving chain to move in such a manner that the slidable device and the fixator move relative to each other, and the slidable device is configured to drive the rotation rod and the fixator to move relative to each other.

3. The display apparatus according to claim 2, further comprising:
   a second gear provided on the fixator, wherein the armrest comprises a second driving chain, and the second gear meshes with the second driving chain and is configured to drive the second driving chain to move in such a manner that the armrest and the fixator move relative to each other.

4. The display apparatus according to claim 3, wherein the fixator comprises a fixing beam extending along the first direction, and the first gear and the second gear are both fixed to the fixing beam.

5. The display apparatus according to claim 4, wherein the slidable device is sleeved on the fixing beam; and the slidable device slides along the fixing beam when the slidable device and the fixator move relative to each other.

6. The display apparatus according to claim 4, wherein the fixator further comprises a blocking plate fixed to the fixing beam and extending along a third direction, the third direction intersects with the first direction, and the first end of the flexible display screen is fixed to the blocking plate.

7. The display apparatus according to claim 3, wherein the armrest further comprises a sliding groove in which the second driving chain is provided.

8. The display apparatus according to claim 3, further comprising:
a transmission connecting the first gear with the second gear, wherein when one of the first gear and the second gear rotates, the transmission drives the other one of the first gear and the second gear to rotate.

9. The display apparatus according to claim 8, wherein the transmission comprises a driving member, and the driving member is contact with the first gear and the second gear; and
when one of the first gear and the second gear rotates, the driving member drives the other one of the first gear and the second gear to rotate, and a rotation direction of the first gear and a rotation direction of the second gear are the same.

10. The display apparatus according to claim 8, wherein the transmission comprises a driving member and a third gear; one of the first gear and the second gear meshes with the third gear, the other one of the first gear and the second gear is connected to the third gear by the driving member; and
when one of the first gear and the second gear rotates, the transmission drives the other one of the first gear and the second gear to rotate, and a rotation direction of the first gear and a rotation direction of the second gear are opposite to each other; or when the third gear rotates, the one of the first gear and the second gear that meshes with the third gear rotates in a direction opposite to a rotation direction of the third gear, and the other one of the first gear and the second gear that is connected to the third gear rotates in a direction same as the rotation direction of the third gear.

11. The display apparatus according to claim 8, further comprising:
a motor configured to drive one of the first gear and the second gear to rotate.

12. The display apparatus according to claim 10, further comprising:
a motor configured to drive the third gear to rotate.

13. The display apparatus according to claim 3, wherein in a process where the rotation rod moves along a direction from a position close to the fixator to a position away from the fixator, a period for driving the first driving chain to move by the first gear is equal to a period for driving the second driving chain to move by the second gear.

14. The display apparatus according to claim 3, wherein a number of chain elements of the second driving chain is greater than or equal to a number of chain elements of the first driving chain.

15. The display panel according to claim 1, wherein the armrest comprises a first side and a second side that are opposite to each other, wherein the second side is located at a side of the first side away from the rotation rod and has a thickness greater than a thickness of the first side.

16. The display apparatus according to claim 15, wherein the second side of the armrest has a circular convex structure.

17. The display apparatus according to claim 1, wherein when the rotation rod does not move relative to the fixator, an edge of the armrest away from the rotation rod is not covered by the flexible display screen.

18. The display apparatus according to claim 1, wherein when the rotation rod does not move relative to the fixator, an edge of the armrest away from the rotation rod is covered by the flexible display screen.

19. The display apparatus according to claim 1, wherein a plurality of concave-convex structures is provided in a part of regions of the armrest.

20. The display apparatus according to claim 1, wherein the armrest further comprises at least one external port, wherein the at least one external port is at least one of a charging port, a headphone port, or a microphone port.

* * * * *